(12) United States Patent
Shimizu et al.

(10) Patent No.: US 7,963,030 B2
(45) Date of Patent: Jun. 21, 2011

(54) MULTILAYER PRINTED CIRCUIT BOARD AND METHOD FOR MANUFACTURING SAME

(75) Inventors: Kazuhiro Shimizu, Ishikawa (JP); Mitsuyuki Takayasu, Ishikawa (JP); Kiyoe Nagai, Ishikawa (JP)

(73) Assignee: Sony Chemical & Information Device Corporation, Tokyo (JP)

( * ) Notice: Subject to any disclaimer, the term of this patent is extended or adjusted under 35 U.S.C. 154(b) by 1051 days.

(21) Appl. No.: 11/720,810

(22) PCT Filed: Sep. 29, 2005

(86) PCT No.: PCT/JP2005/017925
§ 371 (c)(1),
(2), (4) Date: Jun. 4, 2007

(87) PCT Pub. No.: WO2006/059427
PCT Pub. Date: Jun. 8, 2006

(65) Prior Publication Data
US 2009/0288857 A1    Nov. 26, 2009

(30) Foreign Application Priority Data

Dec. 3, 2004 (JP) ................................. 2004-352057

(51) Int. Cl.
*H05K 3/02* (2006.01)
(52) U.S. Cl. ............................ 29/846; 29/850; 174/261
(58) Field of Classification Search .......... 174/256–261; 29/846–853
See application file for complete search history.

(56) References Cited

U.S. PATENT DOCUMENTS

| 6,600,053 B2 * | 7/2003 | Arai et al. ...................... 549/241 |
| 6,787,462 B2 * | 9/2004 | Iijima et al. ................... 438/680 |

FOREIGN PATENT DOCUMENTS

| JP | 06-262375 | 9/1994 |
| JP | 2003-129259 | 5/2003 |
| JP | 2004-265930 | 9/2004 |
| JP | 2004-335926 | 11/2004 |

OTHER PUBLICATIONS

International Search Report dated Nov. 22, 2006 (3 pages).

\* cited by examiner

*Primary Examiner* — Jeremy C Norris
(74) *Attorney, Agent, or Firm* — K&L Gates LLP

(57) ABSTRACT

Disclosed is a multilayer wiring board in which a copper foil is bonded by a thermocompression bonding onto an insulating layer having a bump for interlayer connection buried therein, and the copper foil and the bump are electrically connected to each other. The copper foil is provided with an oxide film having a thickness of 50 Å to 350 Å on a surface in contact with the bump and an insulating layer. In a manufacturing process, for example, an oxide coating of the copper foil to be subject to the thermocompression bonding is removed by acid cleaning, and then an oxide film having an appropriate thickness is formed by irradiating the copper foil with ultraviolet light. Consequently, reliability in electrical connection between the copper foil and the burn is adequately ensured, while achieving sufficient mechanical connection strength between the copper foil and the insulating layer.

2 Claims, 4 Drawing Sheets

MULTILAYER PRINTED CIRCUIT BOARD AND METHOD FOR MANUFACTURING SAME

CROSS REFERENCE TO RELATED APPLICATIONS

The present application claims priority to Japanese Patent Document No. 2004-352057 filed on Dec. 3, 2004, the disclosure of which is herein incorporated by reference.

BACKGROUND

This invention relates to a multilayer wiring board allowing interlayer connection with a bump and to a method for manufacturing the same, and more particularly to a new multilayer wiring board ensuring reliability in connection as well as in junction and to a method for manufacturing the same.

To manufacture a so-called build-up multilayer wiring board, it is necessary to laminate insulating layers and conductive layers one by one to pattern each of the conductive layers to a predetermined wiring pattern and to facilitate interlayer connection between the conductive layers. Consequently, technologies for forming a fine pattern on the conductive layers and for achieving effective interlayer connection become more important.

As a method for manufacturing the build-up multilayer wiring board, such a method has been known that bumps, which are provided to a copper foil, are buried in the insulating layer and thereafter the other copper foil is cemented onto the insulating layer to connect to the bumps (see, e.g., Patent Document 1).

The invention described in Patent Document 1 relates to a selective etching method and a selective etching apparatus both for forming the bumps. Patent Document 1 discloses technologies for manufacturing a multilayer wiring circuit board in which an etching barrier layer is provided to a main face of the copper foil to be provided with the bump; a member used for forming a wiring circuit board, which is provided with a copper foil used for forming a conductive circuit, is used as a base on a main surface of the etching barrier; and this member is processed as appropriate to obtain the multilayer wiring circuit board.

Through the technologies for manufacturing the multilayer wiring circuit board, first, the foil copper of the member used for forming the wiring circuit board is selectively etched to form the bumps for interlayer connection, and the intervals between the bumps are filled by the insulating layer to insulate each of the intervals. Next, the copper foil used for forming the conductive circuit is formed on upper surfaces of the insulating layer and the bumps. Subsequently, wiring films are formed by selectively etching the foil coppers at both upper and lower surfaces. Consequently, the multilayer wiring board is formed, in which the wiring films are provided at both the upper and lower surfaces and the bumps connect the wiring films to each other.

Patent Document 1 is Japanese Patent Laid-Open Publication 2003-129259.

In the multilayer wiring board manufactured by the aforementioned technologies for manufacturing the multilayer wiring circuit board, since electronic connection between the copper foils and the bumps are achieved by a molding thermocompression bonding, ensuring reliability in connection becomes a big challenge. As described above, the insulating layer is formed after formation of the bumps, and the copper foil used for forming the conductive circuit is formed on the upper surfaces of the bumps and cemented onto the insulating layer by a thermocompression bonding. At this time, the copper foil is only in contact with top surfaces of the bumps, thus having a small binding force, so that there are many problems in terms of reliability in connection, such as poor connection caused by a slight external force.

In consideration of the situation described above, bump-connection (connection between the copper foil and the top surface of the bump) has been a high priority, so that the thermocompression bonding is performed in a so-called pure copper condition to minimize oxidation of the copper foil to be used. In view of the bump-connection, since formation of the oxide film on a surface of the copper foil has a disadvantage in conduction, it is more desirable to bring metals into contact with each other. Therefore, reduction of reliability in connection due to the oxide film is prevented by performing the thermocompression bonding immediately after removal of an oxide coating of the copper foil to be used.

However, as a result of earnest investigations made by the inventors, it turned out that the thermocompression bonding upon removal of the oxide coating of the surface of the copper foil results in lack of intimate contact of the cooper foil to the insulating layer, and thus junction strength of the copper foil subjected to the thermocompression bonding cannot be adequately achieved. In fact, it has been seen that a measured value of peel strength of the copper foil subjected to the thermocompression bonding is about 5 N/cm, which is far below required peel strength (about 6 to 10 N/cm). Lack of the junction strength as mentioned above causes accidental separation of the copper foil, thereby creating a more serious problem than lack of the aforementioned reliability in connection.

SUMMARY

This invention is proposed in consideration of the aforementioned conventional situations and is intended to provide a multilayer wiring board superior in reliability in connection between a copper foil and bumps and to a method for manufacturing the multilayer wiring board, with which intimate contact between the copper foil and the insulating layer can be sufficiently achieved and reliability in connection is ensured as well.

To achieve the aforementioned objects, a multilayer wiring board according to this invention includes an insulating layer, a copper foil bonded onto the insulating layer by a thermocompression bonding, a bump for interlayer connection, buried in the insulating layer and electrically connected to the copper foil, and an oxide film having a thickness of 50 Å to 350 Å formed on a surface of the copper foil, which is in contact with the bump and the insulating layer.

This invention is mostly characterized in that the cooper foil is not subject to a thermocompression bonding in a state where the oxide film on a surface is completely removed, but rather the copper foil provided with the oxide film in moderation is used and subjected to the thermocompression bonding to achieve reliability in both connection and junction.

Where the copper foil is bonded to the insulating layer made of, for example, a polyimide resin by the thermocompression bonding, oxidation of the copper foil achieves more intimate contact compared to the copper foil with surface asperities. However, where the oxide film on the surface of the copper foil becomes thicker, reliability of the bump-connection reduces. Thus, this invention realizes reliability in both connection and junction by adjusting a thickness of the oxide film formed on the surface of the copper foil in an appropriate range. That is, intimate contact to the insulating layer is sufficiently achieved by forming the oxide film with 50 Å or greater on the surface of the cooper foil to be subject to the thermocompression bonding. On the other hand, reliability in connection between the copper foil and the bumps is also sufficiently achieved by setting in 350 Å or smaller a thickness of the oxide film on the surface of the copper foil to be subject to the thermocompression bonding.

On the other hand, a method for manufacturing a multilayer wiring layer includes the steps of forming an insulating layer on a base provided with a bump for interlayer connection, bonding a copper foil onto the insulating layer by a thermocompression bonding, and patterning the copper foil, in which the copper foil subjected to the thermocompression bonding is provided with an oxide film through irradiation of a surface in contact with the bump and the insulating layer with ultraviolet light after advance removal of an oxide coating from the copper foil by acid cleaning.

As described above, it is necessary for the thermocompression bonding of the copper foil to adjust a thickness of the oxide film on the surface of the copper foil appropriately. The oxide coating on the surface of the copper foil can be removed by, for example, acid cleaning. However, where the acid film is formed by reoxidation, which is performed by leaving formation of the oxidation film alone after the acid cleaning, a thickness of the oxide film is unstable, making it difficult to certainly adjust the thickness in the aforementioned range. In this invention, the reoxidation is performed by irradiation with ultraviolet light, and thus an oxidation amount of the surface of the copper foil can be appropriately adjusted.

According to the invention as described above, reliability in electrical connection between the copper foil as a wiring layer and the bumps can be sufficiently secured while mechanical junction strength between the copper foil and the insulating layer can be sufficiently achieved. Therefore, this invention can provide the multilayer wiring board with high reliability.

Additional features and advantages of the present invention are described in, and will be apparent from, the following Detailed Description and the Figures.

DETAILED DESCRIPTION

Hereinafter, a multilayer wiring board to which this invention is applied and a method for manufacturing the same will be explained in detail with reference to the drawings.

To facilitate understanding of a structure of the multilayer wiring board according to this invention, the manufacturing method will be explained first. In manufacturing the multilayer wiring board according to this invention, as shown in a first step in FIG. 1, a clad material is prepared first, which is formed by laminating a copper foil 1 used for formation of bumps, an etching barrier layer 2 made of Ni, and a copper foil 3 used as a first wiring layer. Herein, the etching barrier layer 2 exhibits etching-selectivity with respect to the copper foil 1 and functions as an etching stopper at the time of etching of the copper foil 1. The copper foil 3 is eventually formed as a wiring layer by patterning but functions as a supporter as well for supporting the bumps formed by etching the copper foil 1 and the etching barrier layer 2 in this stage.

Figure 1:
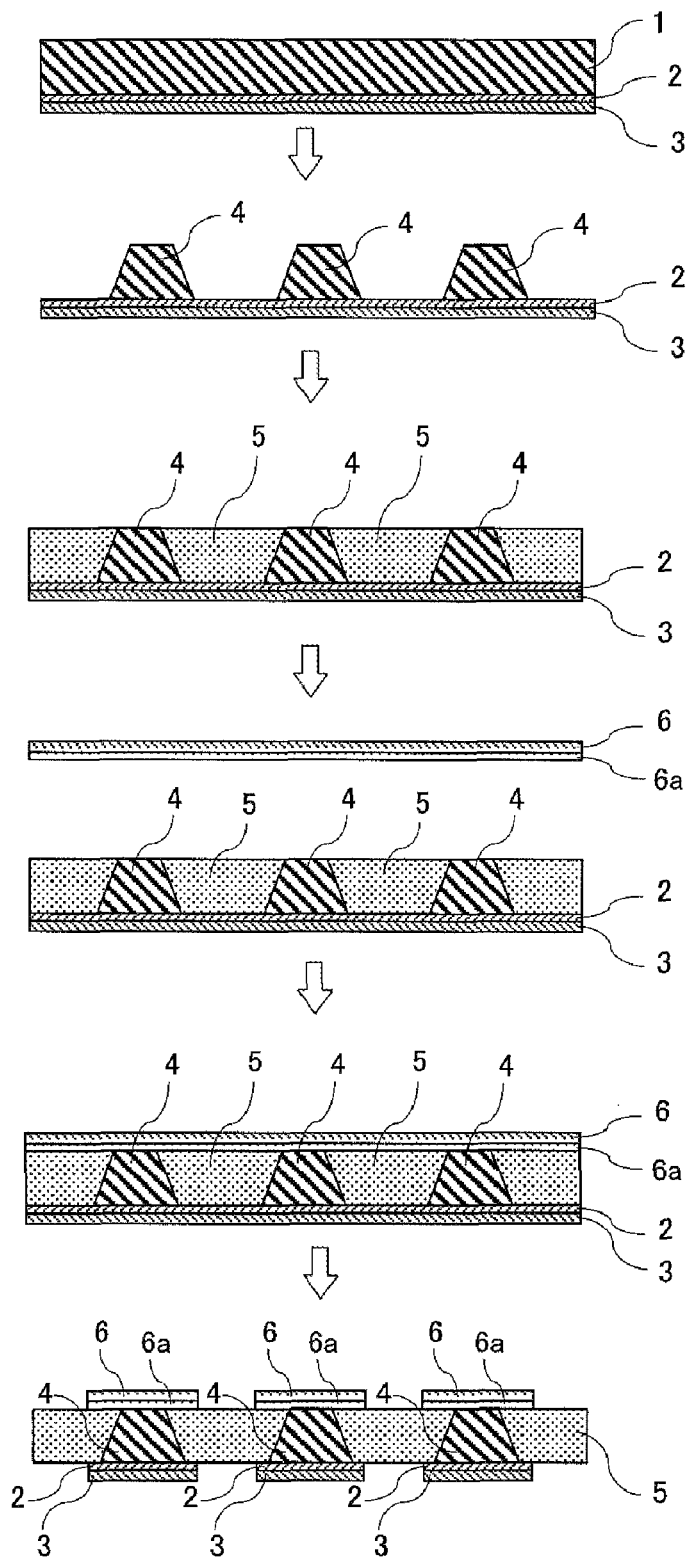
FIG. 1 illustrates an example of a process of manufacturing a multilayer wiring board, in which a first step is a cross-sectional view showing a clad material; a second step is a cross-sectional view showing a process of forming bumps; a third step is a cross-sectional view showing a process of forming an insulating layer; a fourth step is a cross-sectional view showing a process of placing a copper foil; a fifth step is a cross-sectional view showing a thermocompression bonding process of the copper foil; and a sixth step is a cross-sectional view showing a patterning process of the copper foil.

As shown in a second step in FIG. 1, bumps 4 are formed by etching the copper foil 1. It is desirable to perform the etching to the copper foil 1 by combining the etching using acidic etching liquid and the etching using alkali etching liquid. That is, after formation of a resistant film (illustration is omitted) serving as a mask on the copper foil 1, the acidic etching liquid (for example, copper chloride) is sprayed thereon. Thus, the copper foil 1 is subjected to the etching in a manner to set an etching depth using this acidic liquid to be less than a thickness of the copper foil 1 so the etching barrier layer 2 is not exposed. Next, the etching is performed to a remaining area of the copper foil 1 by using the alkali etching acid (for example, ammonium hydroxide) after wet-cleaning (rinsing). The alkali etching liquid hardly affects Ni composing the etching barrier layer 2, so that the etching barrier layer 2 functions as a stopper to stop the etching by the alkali etching liquid. At this time, it is desirable that a pH value of the alkali etching liquid is less than 8.0. By setting the alkali etching liquid to the aforementioned pH, the copper foil 1 can be etched comparatively fast without affecting the etching barrier layer 2. The etching barrier layer 2 is also removed after formation of the bumps 4. In this case, however, only Ni as the etching barrier layer 2 is removed by the etching and an etching liquid is used to the copper foil 3 under the etching barrier layer 2, the etching liquid hardly affecting the copper foil 3.

Next, as shown in the third step in FIG. 1, the insulating layer 5 is formed in a manner to fill intervals between the bumps 4. The insulating layer 5 can be formed by, for example, applying a resin material such as polyimide or bonding a resin film by the thermocompression bonding. As the resin material used herein, an arbitrary material can be selected according to necessary characteristics without the need to consider especially intimate contact, a glass transition point, a linear expansion coefficient, or the like with respect to plating. Furthermore, a thickness or the like is not limited.

After formation of the insulating layer 5, the surface is polished, for example, so that top surfaces of the bumps 4 are exposed. As shown in a fourth step in FIG. 1, a copper foil 6 as a second wiring layer is then placed on the top surfaces 4a, and cemented by means of the thermocompression bonding or the like, as shown in a fifth step in FIG. 1. At this time, the copper foil 6 is previously provided with an oxide film 6a.

In this case, however, it is necessary to adjust a thickness of the oxide film 6a to an appropriate thickness, in particular, within the range of 50 Å to 350 Å. A more preferable thickness is between 150 Å and 250 Å. Normally, the surface of the copper foil is provided with an oxide coating, but a thickness thereof tends to go beyond the aforementioned range. The direct use of the copper foil provided with the thick oxide coating as described above, makes it difficult to ensure reliability in the bump-connection. Thus, in this invention, a surface in contact with the bumps 4 of the copper foil 6 and the insulating layer 5 is provided with the oxide film 6a with an appropriate thickness after the oxide coating is once removed from the surface of the copper foil.

Herein, acid cleaning, for example, may be performed in order to remove the thick oxide coating, which is provided to the surface of the copper foil 6. The oxide coating on the surface of the copper foil 6 can be removed effectively by cleaning the surface with a hydrochloric acid aqueous solution at an appropriate concentration. In this case, it is preferable to perform the acid cleaning on the condition that the oxide coating on the surface of the copper foil 6 can be removed as much as possible.

Next, the surface of the copper foil 6 is provided with the oxide film 6a with an appropriate thickness. The oxide film 6a is formed by irradiating the copper foil 6 with ultraviolet light after the acid cleaning. Excessively rapid oxidation is not desirable and irradiation with ultraviolet light is effective to adjust a thickness of the oxide film 6a within the appropriate range. In formation of the oxide film 6a by irradiation with ultraviolet light, a thickness of the oxide film 6a can arbitrarily be adjusted by selecting irradiation time, so that a thickness of the oxide film 6a can be easily set within the aforementioned range.

The surface of the copper foil 6, on the side opposite to the surface provided with the oxide film 6a, may be provided with the oxide film in a similar manner or may be subjected to an antirust process. Cited as the antirust process are formation of a composite plating film of nickel, chrome, and zinc, a process using a silane coupling agent, and the like.

Figure 2:
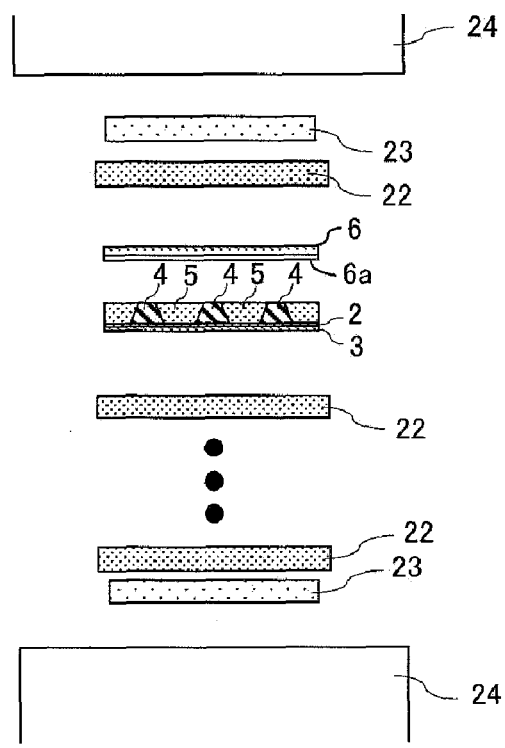
FIG. 2 is a cross-sectional view showing a superposition state in the thermocompression bonding process.

The copper foil 6 provided with the oxide film 6a with an appropriate thickness is cemented onto the insolating layer 5 to perform the bump connection, in which the cementing (molding) is performed by a so-called thermocompression bonding. FIG. 2 shows a superposition state of a product [a laminated body shown in the fifth step in FIG. 1] at the time of the thermocompression bonding.

In the thermocompression bonding of the copper foil 6, the laminated bodies shown in the fourth step or the fifth step in FIG. 1 are placed repeatedly between stainless steel plates 22 and the thermocompression bonding is carried out at once. Outer sides of the stainless steel plates 22 at the outermost parts are provided with cushioning members 23, respectively, through which the laminated body is sandwiched by a press machine.

Figure 3:
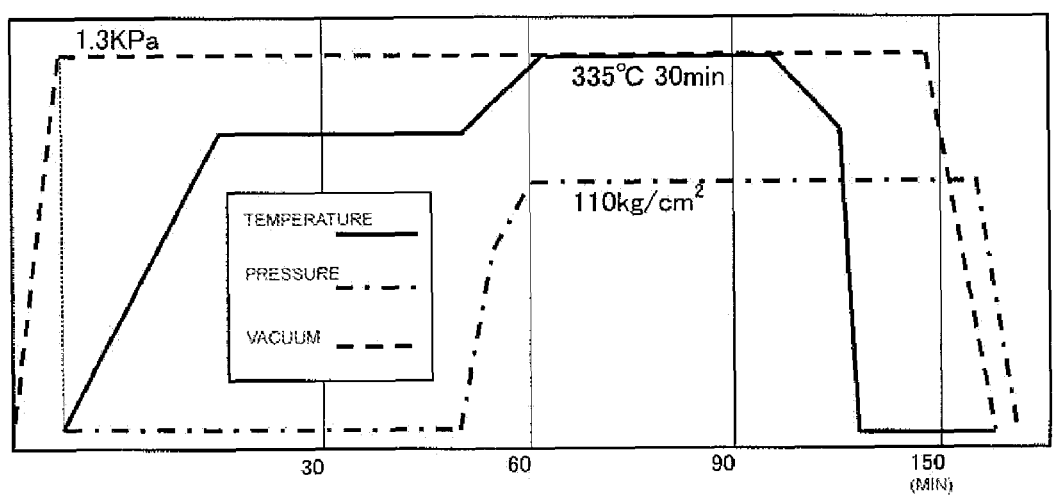
FIG. 3 is a view showing profiles of a temperature, a pressure, and a vacuum in the thermocompression bonding process.

The aforementioned laminated body is directly sandwiched between the stainless steel plates 22. Therefore, each of the stainless steel plates 22 is polished to a mirror-smooth state. A pressure at the time of the press is about 90 to 150 kg/cm$^2$ while a press temperature is about 335 degrees Celsius. FIG. 3 is a view showing one example of a temperature profile, a pressure profile, and a vacuum profile at the time of the press (the thermocompression bonding). In this example, a temperature is raised up to 335 degrees Celsius after advance preheating at 200 degrees Celsius and the press is performed at a pressure of 110 kg/cm$^2$. A vacuum is set to 1.3 kPa.

After the thermocompression bonding of the copper foil 6 as described above, conductive layers (the copper foils 3, 6) on both front and back surfaces are subject to a patterning according to a desired wiring pattern, thereby being set as wiring layers. The aforementioned patterning can be performed by general photolithography and etching technologies.

Since the multilayer wiring board manufactured in the above manner is provided with the oxide film 6a with an appropriate thickness on the surface of the copper foil 6, the copper foil 6 and the insulating layer 5 are coupled with a sufficient mechanical strength in a manner to have an intimate contact therebetween. On the other hand, the oxide film 6a is intervened between the copper foil 6 and the top surfaces of the bumps 4 but is thin enough to ensure sufficient reliability in electrical connection. Thus, reliability in electrical connection and reliability in mechanical junction are mutually compatible with the multilayer wiring board in this embodiment, realizing the multilayer wiring board with high reliability in all aspects.

In the multilayer wiring board described above, a thickness of the oxide film 6a on the surface of the copper foil 6 is important to realize compatibility between the aforementioned reliability in electrical connection and reliability in mechanical junction. Excessive oxidation of the surface of the copper foil 6 precludes connection to the bumps 4. Therefore, a thickness of the aforementioned oxide film 6a is set within the range of 50 Å to 350 Å. With the oxide film 6a with a thickness smaller than or equal to 50 Å, there is fear that ensuring sufficient intimate contact with the insulating layer 5 becomes difficult. On the other hand, the oxide film 6a with a thickness beyond 350 Å is likely to interfere with the bump connection to lose reliability in connection. A thickness of 150 Å to 250 Å is more desirable.

Embodiment

Hereinafter, an embodiment to which this invention is applied will be explained based on an experimental result.

Figure 4:
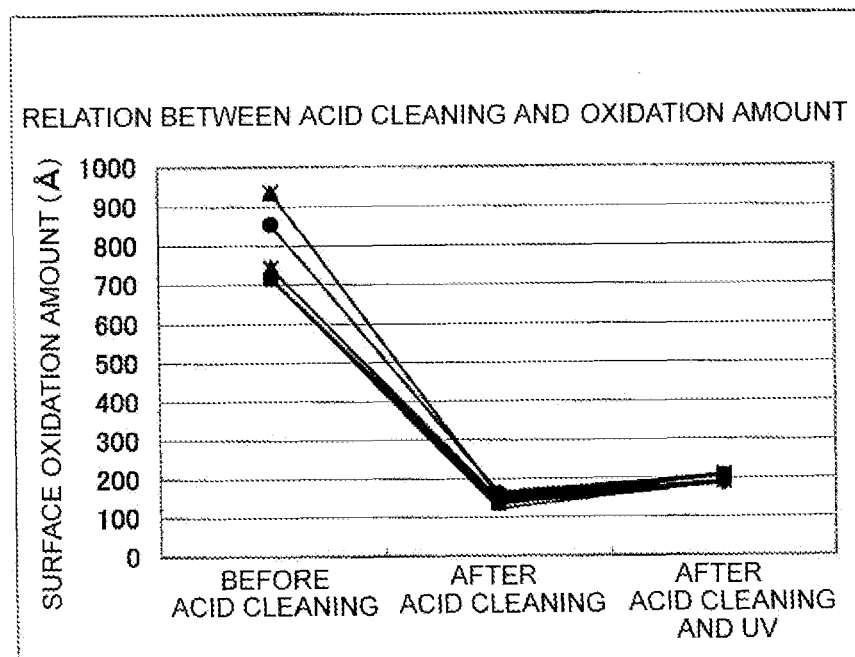
FIG. 4 is a characteristic diagram showing a difference in a thickness of an oxide file before and after acid cleaning and after irradiation with ultraviolet light.
Figure 5:
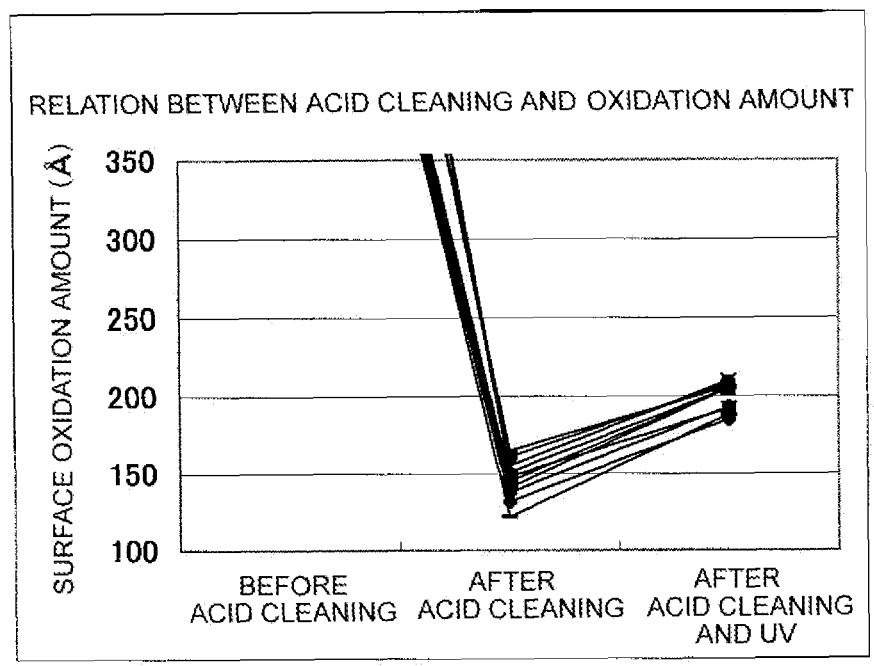
FIG. 5 is a characteristic diagram showing one exploded part of FIG. 4.

In accordance with a sequence of processes shown in FIG. 1, the insulating layer made of a polyimide resin was formed to the copper foil provided with the bumps, and the copper foil was bonded to the insulating layer by the thermocompression bonding. The copper foil used herein has a thickness of 12 μm. After the acid cleaning, the oxide film was formed on the surface of the copper foil by irradiating the copper foil with ultraviolet light. At this time, a thickness of the oxide film on the surface was adjusted by controlling the conditions for the acid cleaning, the conditions for irradiation with ultraviolet light, or the like. FIGS. 4 and 5 show a thickness of the oxide film before and after the acid cleaning and after the irradiation with ultraviolet light.

The thermocompression bonding was performed by the method shown in FIG. 2, with the same profiles of a temperature, a pressure, and a vacuum as shown in FIG. 3. A pressure at the time of the press was about 110 kg/cm$^2$ and a press temperature was about 335 degrees Celsius.

Figure 6:
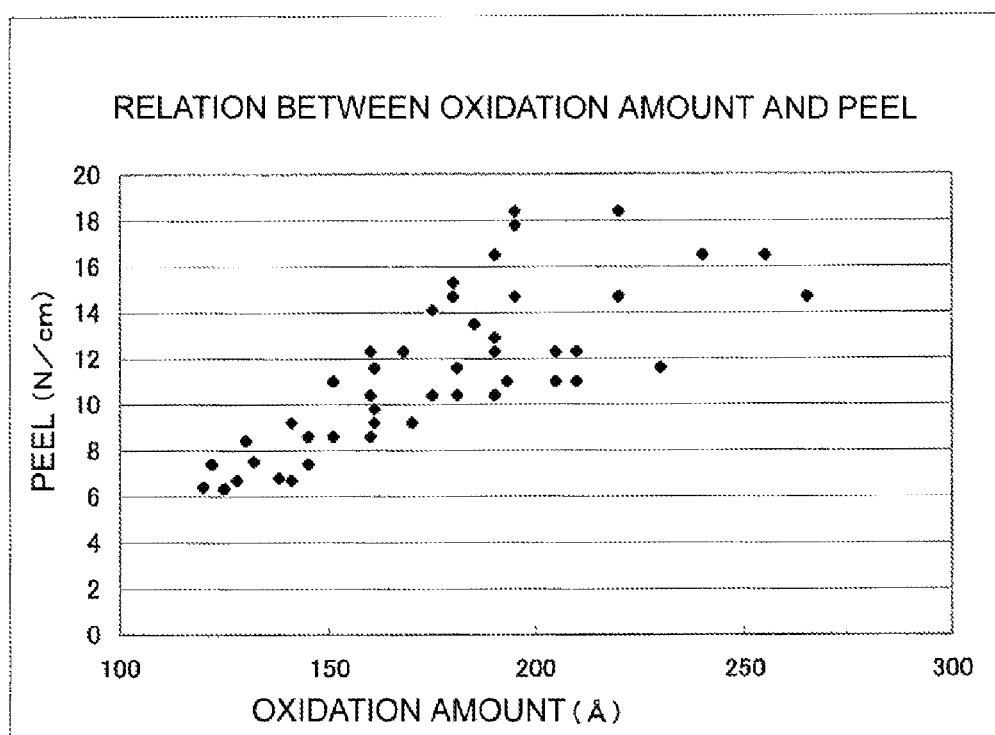
FIG. 6 is a characteristic diagram showing a relation between a thickness of the oxide film on the copper foil and peel strength.

After bonding the copper foil by the thermocompression bonding, peel strength of the copper foil was measured. A relation between a thickness of the oxide film on the surface of the copper foil and peel strength is shown in FIG. 6. A thickness of the oxide film on the surface of the copper foil was calculated from the electrical quantity required or oxidation film reduction (unit: mC [millicoulomb]) per unit area by electrochemical measurement.

As shown in FIG. 6, the thicker the oxide film on the surface of the copper foil becomes, the more peel strength improves. An intimate contact as high as peel strength of 8 N/cm or higher is realized especially in the range where a thickness of the oxide film is 150 Å or more. However, an increase in peel strength is rarely achieved where the oxide film is made thicker than 250 Å. Thus, it is clear that an improving effect of peel strength becomes saturated in this range.

Figure 7:
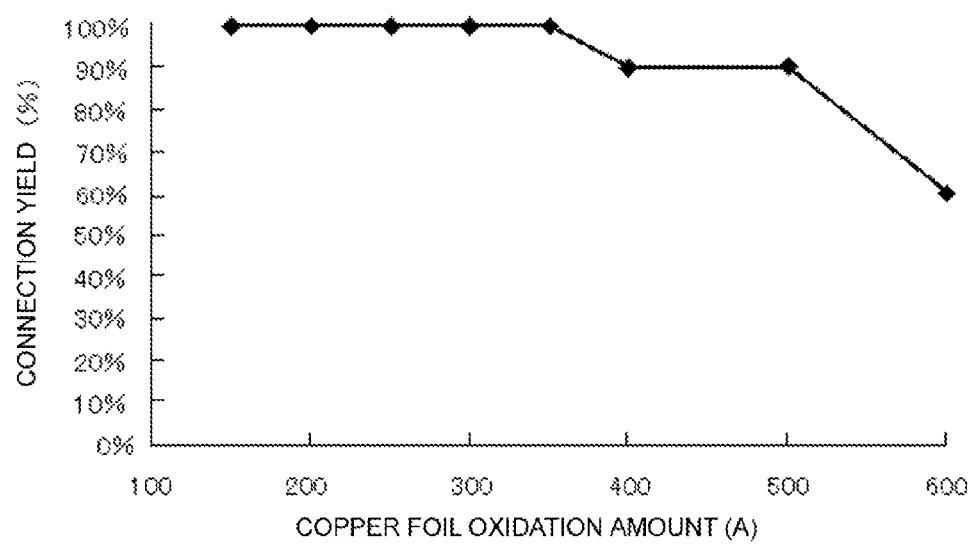
FIG. 7 is a characteristic diagram showing a relation between a thickness of the oxide film on the copper foil and a connection yield.

On the other hand, a connection yield was tested to check reliability in connection between the copper foil and the bumps that have been bonded to each other by the thermocompression bonding. This connection yield was evaluated based on reduction in the connection yield due to a poor connection at the time of manufacturing the multilayer wiring board provided with 5000 bumps. FIG. 7 shows a result. As shown in FIG. 7, the connection yield sharply reduces to severely lose reliability in connection after a thickness of the oxide film on the surface of the copper foil exceeds 350 Å.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

What is claimed is:

1. A method for manufacturing a multilayer wiring board comprising the steps of:
    forming an insulating layer on a base provided with a bump for interlayer connection;
    bonding a copper foil onto the insulating layer by a thermocompression bonding; and
    patterning the copper foil,
    wherein the copper foil subjected to the thermocompression bonding is provided with an oxide film by irradiating a surface in contact with the bump and the insulating layer with ultraviolet light after advance removal of an oxide coating from the copper foil by acid cleaning.

2. The method for manufacturing a multilayer wiring board according to claim 1, wherein the oxide film has a thickness of 50 Å to 350 Å.

* * * * *